(12) United States Patent
Huai et al.

(10) Patent No.: US 7,760,474 B1
(45) Date of Patent: Jul. 20, 2010

(54) MAGNETIC ELEMENT UTILIZING FREE LAYER ENGINEERING

(75) Inventors: Yiming Huai, Pleasanton, CA (US); Zhitao Diao, Fremont, CA (US); Eugene Youjun Chen, Fremont, CA (US)

(73) Assignee: Grandis, Inc., Milpitas, CA (US)

( * ) Notice: Subject to any disclaimer, the term of this patent is extended or adjusted under 35 U.S.C. 154(b) by 813 days.

(21) Appl. No.: 11/487,552

(22) Filed: Jul. 14, 2006

(51) Int. Cl.
*G11B 5/127* (2006.01)
*G11C 11/14* (2006.01)

(52) U.S. Cl. .................. 360/324.12; 365/171; 257/421

(58) Field of Classification Search ............. 360/324.1, 360/324.2, 324.11, 324.12; 428/811.1; 438/3; 257/421, 422, 295; 365/158, 173, 171
See application file for complete search history.

(56) References Cited

U.S. PATENT DOCUMENTS

| | | | |
|---|---|---|---|
| 6,201,673 B1 | 3/2001 | Rottmayer et al. | |
| 6,562,453 B1 | 5/2003 | Futamoto et al. | |
| 6,611,405 B1 | 8/2003 | Inomata et al. | |
| 6,680,126 B1 | 1/2004 | Sambasivan et al. | |
| 6,714,444 B2 | 3/2004 | Huai et al. | |
| 6,775,183 B2 | 8/2004 | Heide | |
| 6,920,063 B2 | 7/2005 | Huai et al. | |
| 6,992,359 B2 | 1/2006 | Nguyen et al. | |
| 7,106,624 B2 | 9/2006 | Huai et al. | |
| 7,110,287 B2 | 9/2006 | Huai et al. | |
| 7,270,896 B2 * | 9/2007 | Parkin | 428/811.1 |
| 7,274,080 B1 * | 9/2007 | Parkin | 257/421 |
| 7,488,609 B1 * | 2/2009 | Lin et al. | 438/3 |
| 2002/0036331 A1 | 3/2002 | Nickel et al. | |
| 2002/0159203 A1 | 10/2002 | Saito et al. | |
| 2003/0162055 A1 | 8/2003 | Lu et al. | |
| 2003/0179510 A1 | 9/2003 | Hayakawa | |
| 2003/0197984 A1 | 10/2003 | Inomata et al. | |
| 2004/0165425 A1 | 8/2004 | Nakamura et al. | |
| 2004/0165428 A1 | 8/2004 | Odagawa et al. | |
| 2005/0057960 A1 | 3/2005 | Saito et al. | |
| 2005/0249979 A1 | 11/2005 | Gill | |

(Continued)

OTHER PUBLICATIONS

Mahendra Pakala, et al., *Method and System for Providing a Highly Textured Magnetoresistance Element and Magnetic Memory*, U.S. Appl. No. 11/294,766.

(Continued)

*Primary Examiner*—Brian E Miller
(74) *Attorney, Agent, or Firm*—Convergent Law Group LLP

(57) ABSTRACT

A method and system for providing a magnetic element are described. The method and system include providing a pinned layer, a barrier layer, and a free layer. The free layer includes a first ferromagnetic layer, a second ferromagnetic layer, and an intermediate layer between the first ferromagnetic layer and the second ferromagnetic layer. The barrier layer resides between the pinned layer and the free layer and includes MgO. The first ferromagnetic layer resides between the barrier layer and the intermediate layer. The first ferromagnetic layer includes at least one of CoFeX and CoNiFeX, with X being selected from the group of B, P, Si, Nb, Zr, Hf, Ta, Ti, and being greater than zero atomic percent and not more than thirty atomic percent. The first ferromagnetic layer is ferromagnetically coupled with the second ferromagnetic layer. The intermediate layer is configured such that the first ferromagnetic layer has a first crystalline orientation and the second ferromagnetic layer has a second crystalline orientation different from the first ferromagnetic layer.

4 Claims, 6 Drawing Sheets

U.S. PATENT DOCUMENTS

| | | | |
|---|---|---|---|
| 2006/0003185 | A1 | 1/2006 | Parkin |
| 2006/0012926 | A1 | 1/2006 | Parkin |
| 2006/0014306 | A1 | 1/2006 | Min et al. |
| 2006/0049472 | A1 | 3/2006 | Diao et al. |
| 2006/0256484 | A1* | 11/2006 | Sato et al. ............... 360/324.2 |
| 2007/0171570 | A1* | 7/2007 | Gill ............................ 360/110 |
| 2007/0268632 | A1* | 11/2007 | Jogo et al. ............. 360/324.12 |
| 2008/0062581 | A1* | 3/2008 | Parkin ................... 360/324.11 |

OTHER PUBLICATIONS

William Reohr, et al., *Memories of Tomorrow*, IEEE Circuits & Devices Magazine, Sep. 2002, pp. 17-27.

Saied Tehrani, et al., *Magnetoresistive Random Access Memory Using Magnetic Tunnel Junctions*, Proceedings of the IEEE, vol. 91, No. 5, May 2003, pp. 703-714.

J. C. Slonczewski, et al., *Conductance and exchange coupling of two ferromagnets separated by a tunneling barrier*, Physical Review B, vol. 39, No. 10, Apr. 1, 1989, pp. 6995-7002.

J.C. Slonczewski, *Current-driven excitation of magnetic multilayers*, Journal of Magnetism and Magnetic Materials, 159 (1996) L1-L7.

L. Berger, *Emission of spin waves by a magnetic multilayer traversed by a current*, Physical Review B, vol. 54, No. 13, Oct. 1, 1996, pp. 9353-9358.

F. J. Albert, et al., *Spin-polarized current switching of a Co thin film nanomagnet*, Applied Physics Letters, vol. 77, No. 23, Dec. 4, 2000, pp. 3809-3811.

Yiming Huai, et al., *Observation of Spin-Transfer Switching in Deep Submicron-Sized and Low-Resistance Magnetic Tunnel Junctions*, Applied Physics Letters 84, 3118 (2004), pp. 1-3.

J. C. Slonczewski, et al., *Currents, Torques, and Polarization Factors in Magnetic Tunnel Junctions*, Physical Review B, Apr. 7, 2004, 1-23.

W. H. Butler, et al., *Spin-dependent tunneling conductance of Fe|MgO|Fe sandwiches*, Physical Review B, vol. 63, 054416, 2001, pp. 1-12.

J. Mathon, et al., *Theory of tunneling magnetoresistance of an epitaxial Fe|MgO|Fe(001) junction*, Physical Review B., vol. 63, 220403(R), 2001, pp. 1-4.

*TMR Device with World Best Performance Fabricated by Mass Manufacturing System*, available @ http://www.aist.go.jp/aist_e/latest_research/2004/20040907/20040907.html, 8 pages.

Parkin et al., "Giant tunneling magnetoresistance at room temperature with MgO (100) tunnel barriers," Nature Materials, vol. 3, Dec. 2004, pp. 862-867, published online Oct. 31, 2004.

Petej et al., Magnetism: Molecules to Materials III. Eds Miller and Drillon 2002, Wiley-VCH Verlag GmbH, pp. 260-261.

* cited by examiner

MAGNETIC ELEMENT UTILIZING FREE LAYER ENGINEERING

FIELD OF THE INVENTION

The present invention relates to magnetic recording and memory systems, and more particularly to a method and system for providing a magnetic element having a large magnetoresistive signal and that may be suitable in magnetic media for example in a hard disk drive and applications utilizing magnetic elements that can be changed or switched using a spin transfer effect for example in microwave generator applications.

BACKGROUND OF THE INVENTION

FIG. 1 depicts a conventional magnetic element 10, which is a conventional magnetic tunneling junction (MTJ). Such a conventional MTJ 10 can be used in magnetic media such as for a hard disk drive (HDD) as well as in other applications. In some applications, such as in a HDD, the magnetization state of the conventional MTJ 10 may be changed by applying an external field, for example using a recording head (not shown). The magnetization state of the conventional MTJ 10 may also be changed using the spin transfer effect, for example in applications such as microwave generators.

The conventional MTJ 10 typically resides on a substrate (not shown), uses seed layer(s) 11 and includes a conventional antiferromagnetic (AFM) layer 12, a conventional pinned layer 14, a conventional barrier layer 16, a conventional free layer 18, and a conventional capping layer 20. The conventional pinned layer 14 and the conventional free layer 18 are ferromagnetic. The ferromagnetic layers 14 and 18 typically include materials from the group of Ni, Co, and Fe and their alloys, such as CoFe, CoFeNi, a low-moment ferromagnetic materials. For example materials such as FeCoB, with B from five through thirty atomic percent are used. Although depicted as simple (single) layers, the pinned layer 14 and free layer 18 may include multiple layers. For example, the pinned layer 14 and/or the free layer 18 may include two ferromagnetic layers antiferromagnetically coupled through a thin Ru layer via RKKY exchange interaction—forming a synthetic antiferromagnetic (SAF) layer. For example, a layer of CoFeB separated by a thin layer of Ru may be used for the conventional pinned layer 14 and/or the conventional free layer 18. The thin layer of Ru may, for example be between three and eight Angstroms thick. The conventional free layer 18 is typically thinner than the conventional pinned layer 14, and has a changeable magnetization 19. The saturation magnetization of the conventional free layer 18 is typically adjusted between four hundred and one thousand four hundred emu/cm³ by varying the composition of elements. The magnetization 15 of the conventional pinned layer 14 is fixed, or pinned, in a particular direction, typically by an exchange-bias interaction with the AFM layer 12.

In order to use the conventional MTJ 10 in certain applications, such as in a HDD, a signal that is large in comparison to external field variations is desired. Thus, a high magnetoresistance is also desirable. For HDD applications, a low RA is also desirable. The low RA is considered to be critical in both reducing noise and allowing an impedance match of the conventional MTJ to an external sense amplifier (not shown) in the read head (not shown). An improved magnetic performance will also benefit process control of switching current distribution.

Such a combination of a high magnetoresistance and a low RA has been achieved in conventional MTJs that use MgO as the conventional barrier layer 16. For example, it has been shown that a magnetoresistance ($\Delta R/R$) of 150% with an RA as low as 3 $\Omega\mu m^2$ can be realized for such a conventional MTJ 10 that uses an MgO for the conventional barrier layer 16 in combination with CoFeB for the conventional free layer 18. Consequently, conventional MTJs 10 that utilize MgO as the conventional barrier layer 16 in combination with CoFeB as the conventional free layer 18 may be used in various device applications.

Although it may be possible to attain a high signal and low RA using the above-described conventional MTJ 10, one of ordinary skill in the art will recognize that such a conventional MTJ 10 has other drawbacks. In particular, the free layer 18 of such a conventional MTJ 10 utilizes an amorphous magnetic layer of CoFeB, with B between zero and thirty atomic percent. However, amorphous layers of CoFeB exhibit a large magnetostriction. This magnetostriction results in poor soft magnetic performance of the conventional free layer 18, making the conventional MTJ 10 unsuitable for use in HDD applications.

In order to address this issue, a conventional free layer 18 using a multilayer of CoFeB and NiFe has been implemented. The NiFe layer improves the soft magnetic performance of the conventional free layer 18. However the use of such a multilayer for the conventional free layer 18 reduces signal achievable by a significant amount. In particular, an anneal at a temperature of approximately at least three hundred degrees Celsius is generally performed to orient the CoFeB layer to a (100) direction and, therefore, obtain a high magnetoresistance. However, an anneal at these temperatures causes growth of the CoFeB layer in an fcc (111) orientation because of the (111) preference of the NiFe layer. This change in orientation of the CoFeB layer results in a lower magnetoresistance. This low magnetoresistance is a disadvantage that reduces the applicability of such conventional MTJs 10 into ultra-high density HDD applications.

Accordingly, what is needed is a system and method for providing a magnetic element that may be utilized in high density HDD and/or other applications. The system and method address such a need.

BRIEF SUMMARY OF THE INVENTION

A method and system for providing a magnetic element are disclosed. The method and system comprise providing a pinned layer, a barrier layer, and a free layer. The free layer includes a first ferromagnetic layer, a second ferromagnetic layer, and an intermediate layer between the first ferromagnetic layer and the second ferromagnetic layer. The barrier layer includes MgO and resides between the pinned layer and the free layer. The first ferromagnetic layer resides between the barrier layer and the intermediate layer. The first ferromagnetic layer includes at least one of CoFeX and CoNiFeX, with X being selected from the group of B, P, Si, Nb, Zr, Hf, Ta, Ti, and being greater than zero atomic percent and not more than thirty atomic percent. The first ferromagnetic layer is ferromagnetically coupled with the second ferromagnetic layer. The intermediate layer is configured such that the first ferromagnetic layer has a first crystalline orientation and the second ferromagnetic layer has a second crystalline orientation different from the first ferromagnetic layer.

According to the method and system disclosed herein, magnetic elements that may have a high magnetoresistance in combination with a low RA may be provided.

DETAILED DESCRIPTION OF THE INVENTION

Figure 1:
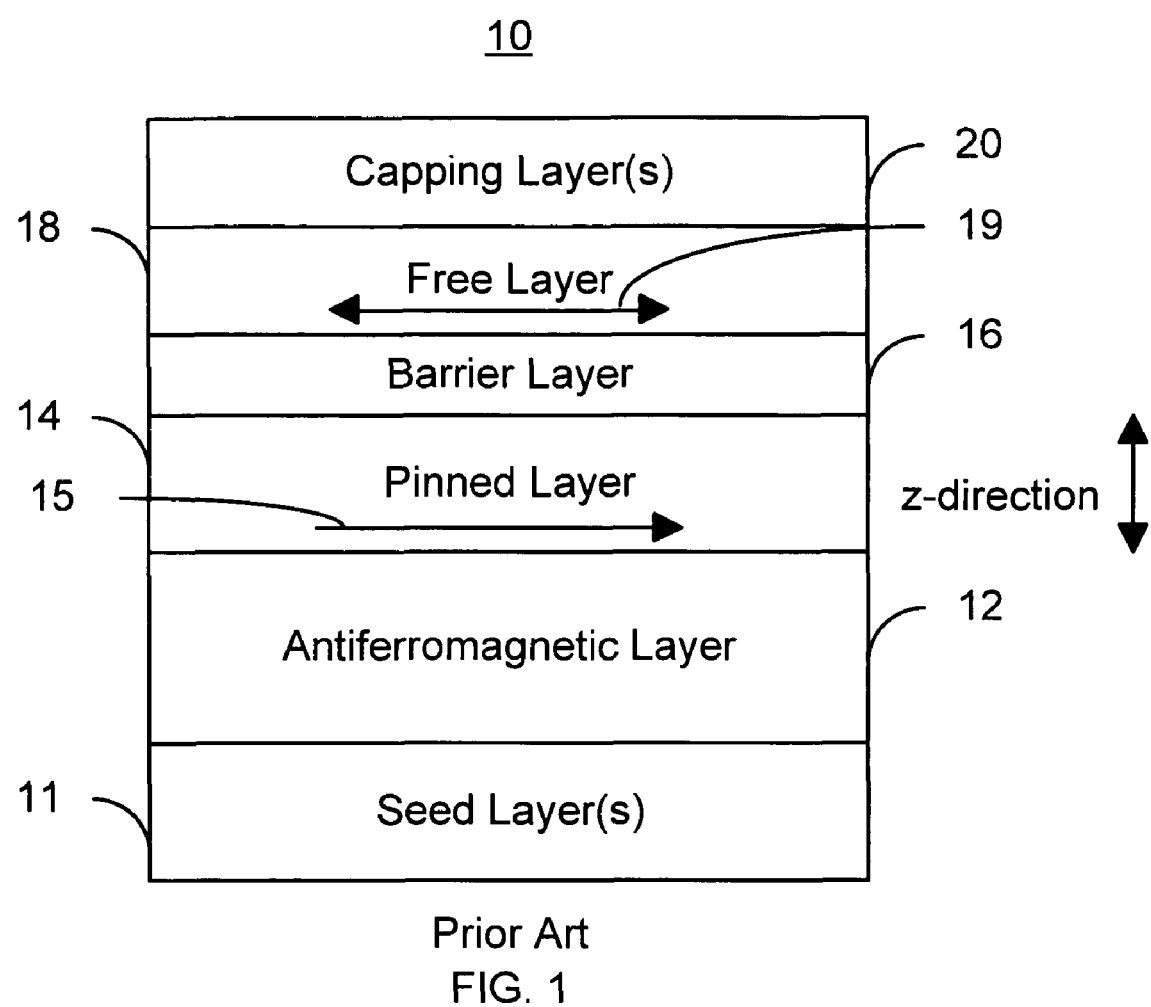
FIG. 1 is a diagram of a conventional magnetic element, a magnetic tunneling junction.

The present invention relates to magnetic elements. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the method and system are not intended to be limited to the embodiments shown, but is to be accorded the widest scope consistent with the principles and features described herein.

A method and system for providing a magnetic element are disclosed. The method and system comprise providing a pinned layer, a barrier layer, and a free layer. The free layer includes a first ferromagnetic layer, a second ferromagnetic layer, and an intermediate layer between the first ferromagnetic layer and the second ferromagnetic layer. The barrier layer includes MgO and resides between the pinned layer and the free layer. The first ferromagnetic layer resides between the barrier layer and the intermediate layer. The first ferromagnetic layer includes at least one of CoFeX and CoNiFeX, with X being selected from the group of B, P, Si, Nb, Zr, Hf, Ta, Ti, and being greater than zero atomic percent and not more than thirty atomic percent. The first ferromagnetic layer is ferromagnetically coupled with the second ferromagnetic layer. The intermediate layer is configured such that the first ferromagnetic layer has a first crystalline orientation and the second ferromagnetic layer has a second crystalline orientation different from the first ferromagnetic layer.

The method and system will be described in terms of a particular magnetic element having certain components. However, one of ordinary skill in the art will readily recognize that this method and system will operate effectively for other magnetic memory elements having different and/or additional components not inconsistent with the method and system. One of ordinary skill in the art will also readily recognize that the method and system are described in the context of a structure having a particular relationship to the substrate. However, one of ordinary skill in the art will readily recognize that the method and system are consistent with other structures having different relationships to the substrate, such as components being ordered differently with respect to the substrate. For example, although certain embodiments are described in the context of bottom (pinned layer at the bottom) structures, one of ordinary skill in the art will readily recognize that the method and system are consistent with top (pinned layer at top) structures. In addition, the method and system are described in the context of certain layers being synthetic and/or simple. However, one of ordinary skill in the art will readily recognize that the layers could have another structure. Furthermore, the method and system are described in the context of magnetic elements having particular layers. However, one of ordinary skill in the art will readily recognize that magnetic elements having additional and/or different layers not inconsistent with the method and system could also be used. Moreover, certain components are described as being ferromagnetic. However, as used herein, the term ferromagnetic could include ferrimagnetic or like structures. Thus, as used herein, the term "ferromagnetic" includes, but is not limited to ferromagnets and ferrimagnets. The method and system are also described in the context of single elements. However, one of ordinary skill in the art will readily recognize that the method and system are consistent with the use of magnetic memories having multiple elements, bit lines, and word lines.

Figure 2:
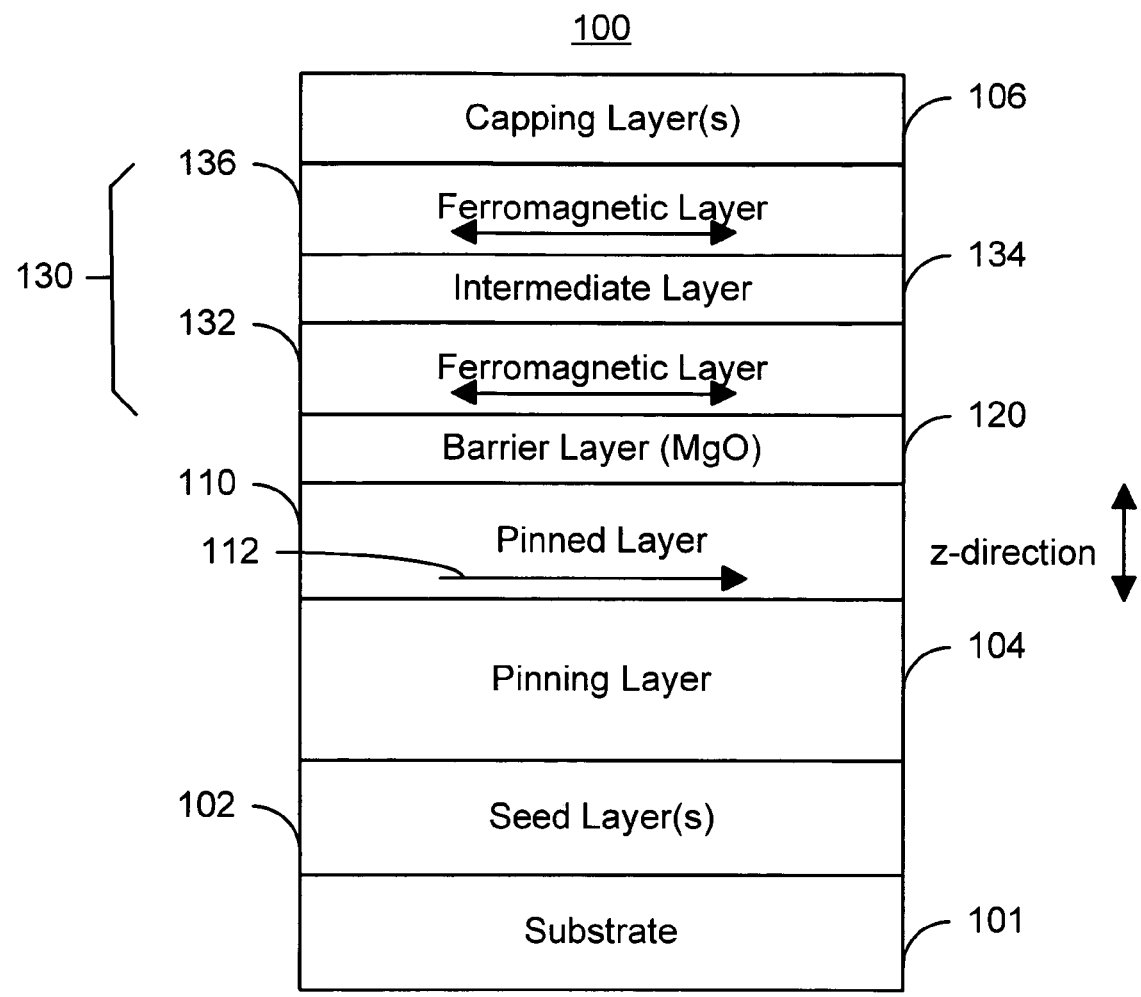
FIG. 2 is a diagram of an exemplary embodiment of a magnetic element having an engineered free layer.

FIG. 2 is a diagram of one exemplary embodiment of a magnetic element 100 having an engineered free layer. The magnetic element 100 is a MTJ 100. The MTJ 100 includes a pinned layer 110, a barrier layer 120, and a free layer 130. The MTJ 100 also preferably may include seed layer(s) 102, pinning layer 104, capping layer(s) 106 and is formed on a substrate 101. For example, the seed layer(s) 102 may include a bilayer of TaN and NiFeCr (on the TaN) or a bilayer of Ta and NiFeCr (on the Ta). The capping layer(s) 106 may include a bilayer of Ru and Ta (on the Ru) or a trilayer of Ru, Cu (on the Ru), and Ta (on the Cu).

The pinning layer 104 is preferably an antiferromagnetic (AFM) layer, for example including PtMn and/or IrMn. The pinning layer 104 is used to pin the magnetization 112 of the pinned layer 110 in a desired direction. However, in another embodiment, another mechanism might be used for pinning the magnetization 112 in the desired direction.

The pinned layer 110 preferably includes at least one of Co, Ni, and Fe. The pinned layer 110 has its magnetization 112 pinned in the desired direction, which may, for example, be along or perpendicular to the easy axis of the free layer 130. The pinned layer 110 is shown as a simple layer. However, the pinned layer 110 may be a multilayer. For example, the pinned layer 110 may be an SAF layer including two ferromagnetic layers separated by a thin non-magnetic conductive layer, such as Ru. The ferromagnetic layers for such an SAF would preferably have their magnetizations aligned antiparallel.

The barrier layer 120 is nonmagnetic and insulating. The barrier layer 120 is thin, allowing tunneling of charge carriers through the barrier layer 120 when a current is driven through the MTJ 100 in a current-perpendicular-to-plane (CPP) configuration (in the z-direction in FIG. 2). Consequently, current carriers may tunnel through the barrier layer 120. In a preferred embodiment, the material(s) used for the barrier layer 120 includes MgO. In such an embodiment, the MgO is preferably crystalline, cubic in structure, and has (100) orientation. As a result, the MTJ 100 may have a high magnetoresistance.

The free layer 130 includes ferromagnetic layers 132 and 136 separated by an intermediate layer 134. In some embodiments, for example used in microwave generator applications, the magnetic element 100 may be configured such that the free layer 130 may have its magnetic state changed due to spin transfer. Consequently, the dimensions of the free layer 130 for such applications are preferably small, in the range of few hundred nanometers. The ferromagnetic layers 132 and 136 are ferromagnetically coupled, for example through RKKY, orange peel coupling, or pinholes. The ferromagnetic layer 132 is preferably CoFeX or CoFeNiX, where X is selected from the group of B, P, Si, Nb, Zr, Hf, Ta, Ti. In addition, X is from zero atomic percent to not more than thirty atomic percent. In a preferred embodiment, X is at least five atomic percent. Thus, the ferromagnetic layer 132 preferably uses amorphous materials that transform to crystal structures with desired texture after post heat treatment and recrystallization. Thus, the ferromagnetic layer 132 is preferably configured to have a higher magnetoresistance, particularly when used with an MgO barrier layer 120. The ferromagnetic layer 136 preferably includes CoFeY or NiFe, where Y is selected from the group of B, P, Si, Nb, Zr, Hf, Ta, and Ti. In addition, Y is from zero atomic percent to not more than thirty atomic percent. In a preferred embodiment, Y is at least five atomic percent.

The intermediate layer 134 is nonmagnetic and configured such that the ferromagnetic layers 132 and 136 have different crystalline orientations. The intermediate layer 134 can be considered to be configured for texture reconstruction or as a separate layer around which the free layer 130 has different crystalline orientations. These different crystalline orientations are configured to maintain a high magnetoresistance (signal) while providing better soft magnetic performance. The intermediate layer 134 may thus act as an intermediate media that either stops texture epitaxial growth between different parts/layers 132 and 136 of the free layer 130 if the intermediate layer 134 is in a thin regime, or bridges the parts 132 and 136 of the free layer 130 having different crystalline orientations if the intermediate layer 134 is in a thicker regime. The intermediate layer 134 may include at least one of Ru, Ir, Rh, Hf, Zr, Ta, and Ti. In the thin regime, the intermediate layer 134 of Ru may have a thickness of less than ten Angstroms. In the thicker regime, the intermediate layer 134 of Ru may have a thickness of at least ten Angstroms, but not so thick that the ferromagnetic layers 132 and 136 are no longer ferromagnetically aligned. However, the intermediate layer 134 is preferably Ru having a thickness of at least one Angstrom and not more than five Angstroms. In a preferred embodiment, the orientation of the ferromagnetic layer 132 is (002), while the orientation of the ferromagnetic layer 136 is (111). Also in a preferred embodiment, the orientation of the intermediate layer 134 is hcp (002). Thus, the intermediate layer 134 may help to prevent crystalline propagation from the ferromagnetic layer 136 to the ferromagnetic layer 132 due to a post-deposition anneal, for example at temperatures at or above approximately three hundred degrees Celsius. In addition, the intermediate layer 134 preferably prevents atomic interdiffusion during such a post-deposition anneal.

Because the ferromagnetic layer 132 has a particular orientation, preferably includes CoFeX, as described above, and is used in conjunction with the barrier layer 120 that is preferably crystalline MgO, the MTJ 100 may have a large magnetoresistance. This large magnetoresistance is due to the large asymmetry of the spin dependent electronic band structures at barriers and electrodes. Furthermore, use of CoFeB provides an improved thermal stability due to the use of the B. The B may reduce or prevent interfacial interdiffusion of metal atoms at elevated temperatures. Consequently, the structural or electrical degradation of the MTJ 100 due to temperature disturbances and electrical stress may be reduced. Because of the use of the intermediate layer 134, the free layer 130 may have improved soft magnetic properties. For example, NiFe may be used for the ferromagnetic layer 136 to improve the soft magnetic properties and reduce magnetostriction substantially without adversely affecting the magnetoresistance. Thus, the MTJ 100 may have improved the sensitivity when used in applications such as a magnetic recording head or in a conventional (field-switched) magnetic memory. In addition, for spin transfer switching applications, the MTJ 100 may have a smaller spin transfer current switching distribution. Moreover, processing instabilities due to external or structural stresses may be removed. Consequently, the MTJ 100 may be more suitable for high density recording applications, both in reading and storing data.

Figure 3:
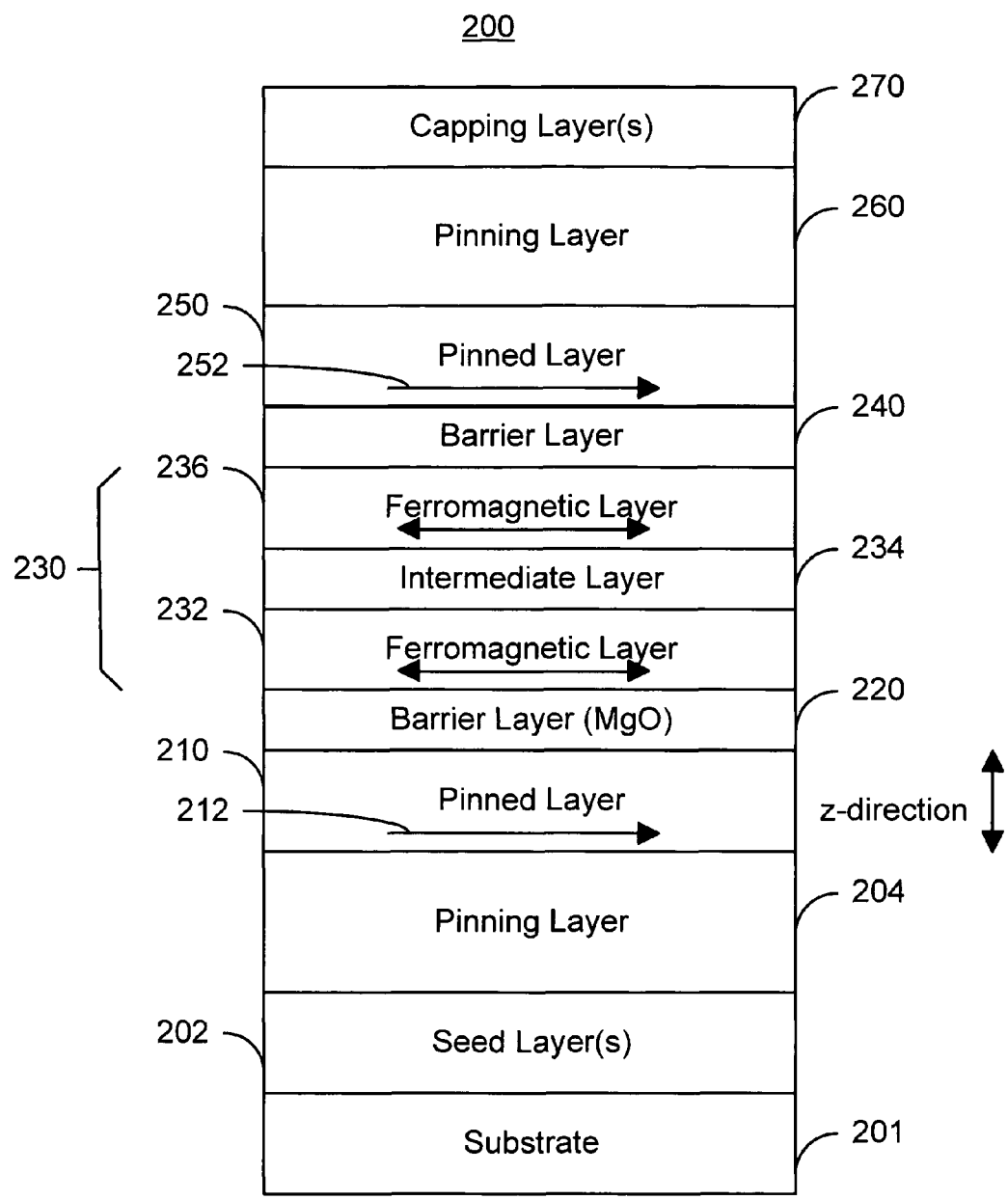
FIG. 3 is a diagram of another exemplary embodiment of a magnetic element having an engineered free layer.

FIG. 3 is a diagram of another exemplary embodiment of a magnetic element 200 having an engineered free layer. The magnetic element 200 is a dual MTJ 200. The dual MTJ 200 includes a first pinned layer 210, a first barrier layer 220, a free layer 230, a second barrier layer 240, and a second pinned layer 250. The dual MTJ 200 may thus be considered to incorporate the MTJ 100 (for example in layers 210, 220, and 230 or 230, 240, and 250), but have additional layers (for example layers 240 and 250 or 210 and 220, respectively). The dual MTJ 200 also preferably may include seed layer(s) 202, first pinning layer 204, second pinning layer 260, and capping layer(s) 270 and is formed on a substrate 201. For example, the seed layer(s) 202 may include a bilayer of TaN and NiFeCr (on the TaN) or a bilayer of Ta and NiFeCr (on the Ta). The capping layer(s) 270 may include a bilayer of Ru and Ta (on the Ru) or a trilayer of Ru, Cu (on the Ru), and Ta (on the Cu).

The pinning layers 204 and 260 are preferably an AFM layers, for example including PtMn and/or IrMn. The pinning layer 204 and 260 are used to pin the magnetizations 212 and 252 of the pinned layers 210 and 250, respectively, in a desired direction. However, in another embodiment, another mechanism might be used for pinning the magnetizations 212 and 252 in the desired direction. In a preferred embodiment for magnetic memory applications, the magnetizations 212 and 252 are preferably parallel. However, other orientations may be used.

The pinned layers 210 and 250 each preferably includes at least one of Co, Ni, and Fe. The pinned layers 210 and 250 each has its magnetization 212 and 252, respectively, pinned in the desired direction(s). These direction(s) may, for example, be along or perpendicular to the easy axis of the free layer 230. The pinned layers 210 and 250 are shown as simple layers. However, the pinned layer 210 and/or 250 may be a multilayer. For example, the pinned layer 210 and/or 250 may be an SAF layer including two ferromagnetic layers separated by a thin non-magnetic conductive layer, such as Ru. The ferromagnetic layers for such an SAF would preferably have their magnetizations aligned antiparallel.

The barrier layers 220 and 240 are nonmagnetic and insulating. The barrier layers 220 and 240 are each thin, allowing tunneling of charge carriers through the barrier layer 220 and 240 when a current is driven through the dual MTJ 200 in a current-perpendicular-to-plane (CPP) configuration (in the z-direction in FIG. 3). Consequently, current carriers may tunnel through the barrier layer 220 and the barrier layer 240. In a preferred embodiment, the material(s) used for the barrier layer 220 includes MgO. In such an embodiment, the MgO is preferably crystalline, cubic in structure, and has (100) orientation. The barrier layer 240 may thus be crystalline or amorphous. As a result, the dual MTJ 200 may have a high magnetoresistance. Also in a preferred embodiment, the barrier layer 240 includes either MgO or aluminum oxide.

The free layer 230 is analogous to the free layer 130 depicted in FIG. 2. Referring back to FIG. 3, the free layer 230 thus includes ferromagnetic layers 232 and 236 separated by an intermediate layer 234. In some embodiments, the magnetic element 200 may be configured such that the free layer 230 may have its magnetic state changed due to spin transfer. Consequently, the dimensions of the free layer 230 for such applications are preferably small, in the range of few hundred nanometers. The ferromagnetic layers 232 and 236 are ferromagnetically coupled, for example through RKKY, orange peel coupling, or pinholes. The ferromagnetic layer 232 is preferably CoFeX or CoFeNiX, where X is selected from the group of B, P, Si, Nb, Zr, Hf, Ta, and Ti. In addition, X is from zero atomic percent to not more than thirty atomic percent. In a preferred embodiment, X is at least five atomic percent. Thus, the ferromagnetic layer 232 preferably uses amorphous materials that transform to crystal structures with desired texture after post heat treatment and recrystallization. Thus, the ferromagnetic layer 232 is preferably configured to have a higher magnetoresistance, particularly when used with an MgO barrier layer 220. The ferromagnetic layer 236 preferably includes CoFeY or NiFe, where Y is selected from the group of B, P, Si, Nb, Zr, Hf, Ta, and Ti. In addition, Y is from zero atomic percent to not more than thirty atomic percent. In a preferred embodiment, Y is at least five atomic percent.

The intermediate layer 234 is nonmagnetic and configured such that the ferromagnetic layers 232 and 236 have different crystalline orientations. The intermediate layer 234 can be considered to be configured for texture reconstruction or as a separate layer around which the free layer 230 has different crystalline orientations.

These different crystalline orientations are configured to maintain a high magnetoresistance (signal) while providing better soft magnetic performance. The intermediate layer 234 may thus act as an intermediate media that either stops texture epitaxial growth between different parts/layers 232 and 236 of the free layer 230 if the intermediate layer 234 is in a thin regime, or bridges the parts 232 and 236 of the free layer 230 having different crystalline orientations if the intermediate layer 234 is in a thicker regime. The intermediate layer 234 may include at least one of Ru, Ir, Rh, Hf, Zr, Ta, and Ti. However, the intermediate layer 234 is preferably Ru having a thickness of at least one Angstrom and not more than five Angstroms. In a preferred embodiment, the orientation of the ferromagnetic layer 232 is (002), while the orientation of the ferromagnetic layer 236 is (111). Also in a preferred embodiment, the orientation of the intermediate layer 234 is hcp (002). Thus, the intermediate layer 234 may help to prevent crystalline propagation from the ferromagnetic layer 236 to the ferromagnetic layer 232 due to a post-deposition anneal, for example at temperatures at or above approximately three hundred degrees Celsius. In addition, the intermediate layer 234 preferably prevents atomic interdiffusion during such a post-deposition anneal.

The dual MTJ 200 shares many of the benefits of the MTJ 100. Thus, the MTJ 200 has improved magnetoresistance, thermal stability, resistance to electrical stresses, and soft magnetic properties. Moreover, an enhanced signal due to the presence of two pinned layers 210 and 250 may be achieved. Thus, the dual MTJ 200 may be suitable for HDD and field-switched magnetic memories.

Figure 4:
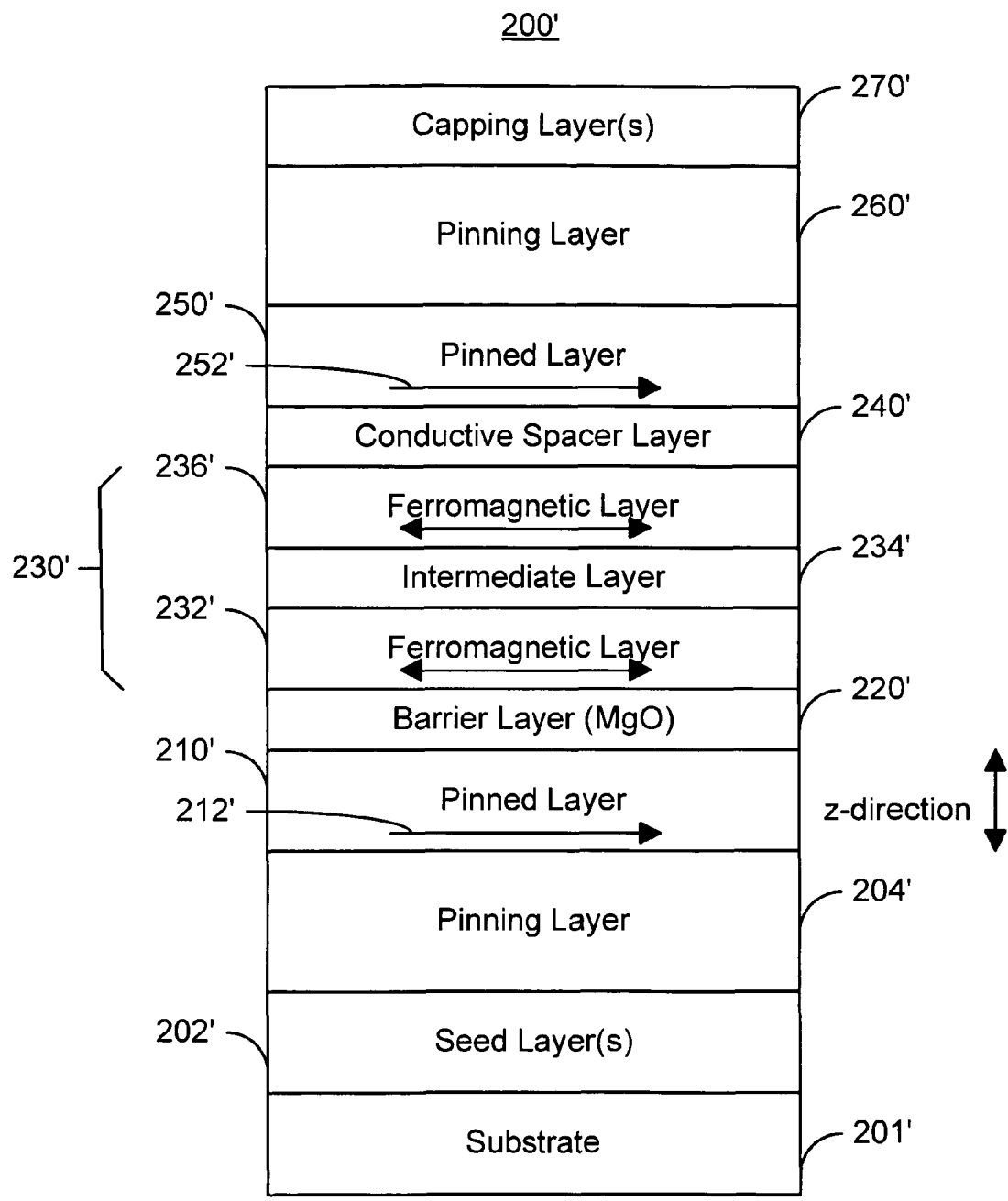
FIG. 4 is a diagram of another exemplary embodiment of a magnetic element having an engineered free layer.

FIG. 4 is a diagram of another exemplary embodiment of a magnetic element 200' having an engineered free layer. The magnetic element 200' is a hybrid structure termed herein a hybrid magnetic element 200'. The hybrid magnetic element 200' includes a first pinned layer 210', a barrier layer 220', a free layer 230', a spacer layer 240' that is conductive, and a second pinned layer 250'. The hybrid magnetic element 200' may thus be considered to incorporate the MTJ 100 (in layers 210', 220', and 230'), but have additional layers (layers 240' and 250'). The hybrid magnetic element 200' may also be considered to incorporate a spin valve (in layers 230', 240', and 250'). The hybrid magnetic element 200' also preferably may include seed layer(s) 202', first pinning layer 204', second pinning layer 260', and capping layer(s) 270' and is formed on a substrate 201'. For example, the seed layer(s) 202' may include a bilayer of TaN and NiFeCr (on the TaN) or a bilayer of Ta and NiFeCr (on the Ta). The capping layer(s) 270' may include a bilayer of Ru and Ta (on the Ru) or a trilayer of Ru, Cu (on the Ru), and Ta (on the Cu).

The pinning layers 204' and 260' are preferably an AFM layers, for example including PtMn and/or IrMn. The pinning layers 204' and 260' are used to pin the magnetizations 212' and 252' of the pinned layers 210' and 250', respectively, in a desired direction. However, in another embodiment, another mechanism might be used for pinning the magnetizations 212' and 252'. In a preferred embodiment for magnetic memory applications, the magnetizations 212' and 252' are preferably parallel. However, other orientations may be used.

The pinned layers 210' and 250' each preferably includes at least one of Co, Ni, and Fe. The pinned layers 210' and 250' each has its magnetization 212' and 252', respectively, pinned in the desired direction(s). These direction(s) may, for example, be along or perpendicular to the easy axis of the free layer 230'. The pinned layers 210' and 250' are shown as simple layers. However, the pinned layer 210' and/or 250' may be a multilayer. For example, the pinned layer 210' and/or 250' may be an SAF layer including two ferromagnetic layers separated by a thin non-magnetic conductive layer, such as Ru. The ferromagnetic layers for such an SAF would preferably have their magnetizations aligned antiparallel.

The barrier layer 220' is nonmagnetic and insulating. The barrier layer 220' is thin, allowing tunneling of charge carriers through the barrier layer 220' when a current is driven through the dual MTJ 200' in a current-perpendicular-to-plane (CPP) configuration (in the z-direction in FIG. 4). Consequently, current carriers may tunnel through the barrier layer 220'. In a preferred embodiment, the material(s) used for the barrier layer 220' includes MgO. In such an embodiment, the MgO is preferably crystalline, cubic in structure, and has (100) orientation. As a result, the hybrid magnetic element 200' may have a high magnetoresistance.

The spacer layer 240' is conductive. For example, the spacer layer 240' may include Cu and/or Ru. Thus, the spacer layer 240' may be a multilayer. As a result, the resistance of the spin valve portion (layers 230', 240', and 250') of the hybrid magnetic element 200' may have a low resistance, yet contribute to the magnetoresistance.

The free layer 230' is analogous to the free layer 130 depicted in FIG. 2 and the free layer 230 depicted in FIG. 3. Referring back to FIG. 4, the free layer 230' thus includes ferromagnetic layers 232' and 236' separated by an intermediate layer 234'. In some embodiments, the magnetic element 200' may be configured such that the free layer 230' may have its magnetic state changed due to spin transfer. Consequently, the dimensions of the free layer 230' for such applications are preferably small, in the range of few hundred nanometers. The ferromagnetic layers 232' and 236' are ferromagnetically coupled, for example through RICKY, orange peel coupling, or pinholes. The ferromagnetic layer 232' is preferably CoFeX or CoFeNiX, where X is selected from the group of B, P, Si, Nb, Zr, Hf, Ta, and Ti. In addition, X is from zero atomic percent to not more than thirty atomic percent. In a preferred embodiment, X is at least five atomic percent. Thus, the ferromagnetic layer 232' preferably uses amorphous materials that transform to crystal structures with desired texture after post heat treatment and recrystallization. Thus, the ferromagnetic layer 232' is preferably configured to have a higher magnetoresistance, particularly when used with an MgO barrier layer 220'. The ferromagnetic layer 236' preferably includes CoFeY or NiFe, where Y is selected from the group of B, P, Si, Nb, Zr, Hf, Ta, and Ti. In addition, Y is from zero atomic percent to not more than thirty atomic percent. In a preferred embodiment, Y is at least five atomic percent.

The intermediate layer 234' is nonmagnetic and configured such that the ferromagnetic layers 232' and 236' have different crystalline orientations. The intermediate layer 234' can be considered to be configured for texture reconstruction or as a separate layer around which the free layer 230' has different crystalline orientations. These different crystalline orientations are configured to maintain a high magnetoresistance (signal) while providing better soft magnetic performance. The intermediate layer 234' may thus act as an intermediate media that either stops texture epitaxial growth between different parts/layers 232' and 236' of the free layer 230' if the intermediate layer 234' is in a thin regime, or bridges the parts 232' and 236' of the free layer 230' having different crystalline orientations if the intermediate layer 234' is in a thicker regime. The intermediate layer 234' may include at least one of Ru, Ir, Rh, Hf, Zr, Ta, and Ti. However, the intermediate layer 234' is preferably Ru having a thickness of at least one Angstrom and not more than five Angstroms. In a preferred embodiment, the orientation of the ferromagnetic layer 232' is (002), while the orientation of the ferromagnetic layer 236' is (111). Also in a preferred embodiment, the orientation of the intermediate layer 234' is hcp (002). Thus, the intermediate layer 234' may help to prevent crystalline propagation from the ferromagnetic layer 236' to the ferromagnetic layer 232' due to a post-deposition anneal, for example at temperatures at or above approximately three hundred degrees Celsius. In addition, the intermediate layer 234' preferably prevents atomic interdiffusion during such a post-deposition anneal.

The hybrid magnetic element 200' shares many of the benefits of the MTJ 100 and the dual MTJ 200. Thus, the hybrid magnetic element 200' has improved magnetoresistance, thermal stability, resistance to electrical stresses, and soft magnetic properties. Moreover, an enhanced signal due to the presence of two pinned layers 210' and 250' may be achieved.

Figure 5:
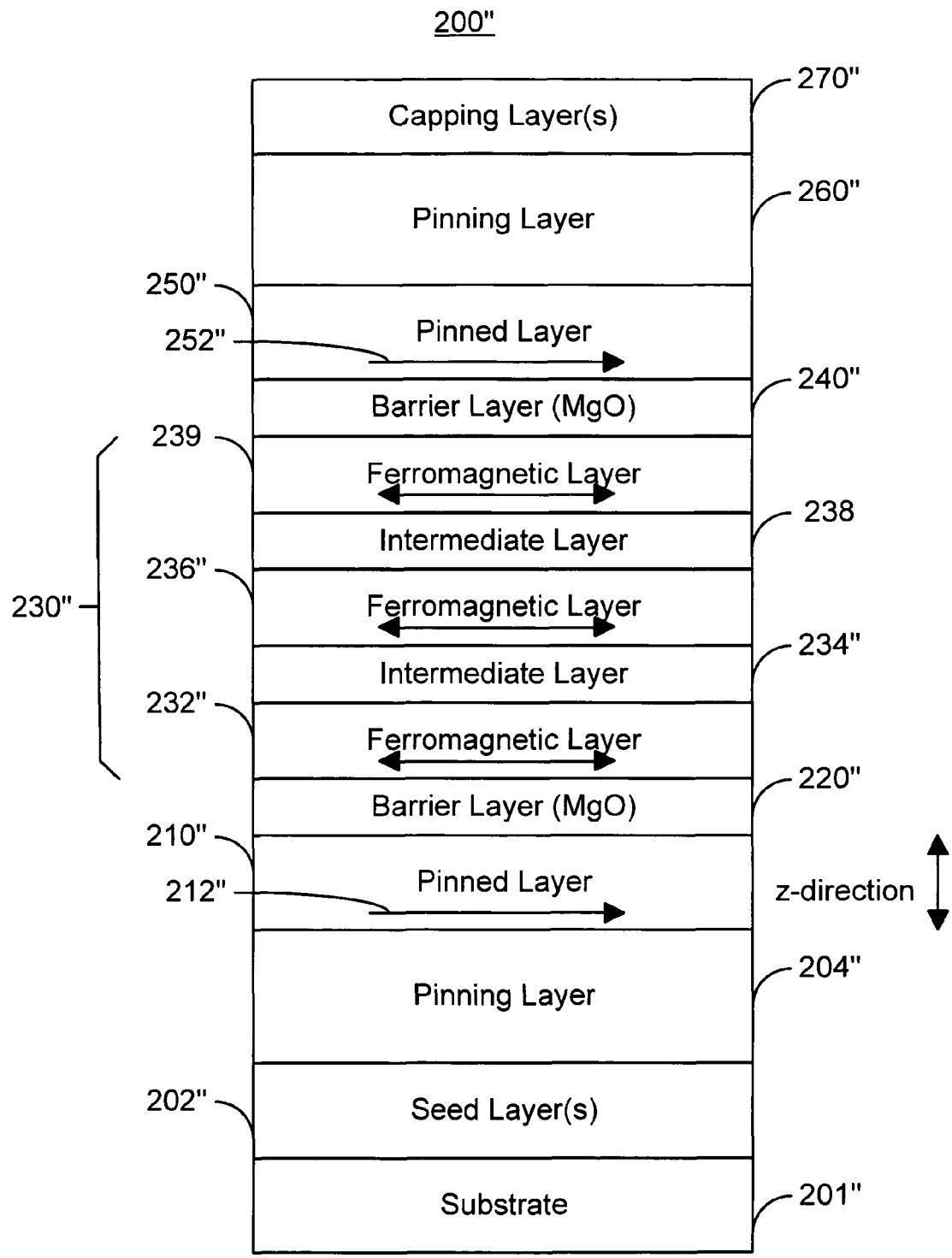
FIG. 5 is a diagram of another exemplary embodiment of a magnetic element having an engineered free layer.

FIG. 5 is a diagram of another embodiment of a magnetic element 200" in accordance with the present invention having an engineered free layer. The magnetic element 200" is preferably a dual MTJ 200". The dual MTJ 200" includes a first pinned layer 210", a first barrier layer 220", a free layer 230", a spacer layer that is preferably a second barrier layer 240", and a second pinned layer 250". The dual MTJ 200" may thus be considered to incorporate the MTJ 100 (for example in layers 210", 220", and 230" or 230", 240", and 250"), but have additional layers (for example layers 240" and 250" or 210" and 220", respectively). The dual MTJ 200" also preferably may include seed layer(s) 202", first pinning layer 204", second pinning layer 260", and capping layer(s) 270" and is formed on a substrate 201". For example, the seed layer(s) 202" may include a bilayer of TaN and NiFeCr (on the TaN) or a bilayer of Ta and NiFeCr (on the Ta). The capping layer(s) 270" may include a bilayer of Ru and Ta (on the Ru) or a trilayer of Ru, Cu (on the Ru), and Ta (on the Cu).

The pinning layers 204" and 260" are preferably an AFM layers, for example including PtMn and/or IrMn. The pinning layer 204" and 260" are used to pin the magnetizations 212" and 252" of the pinned layers 210" and 250", respectively, in a desired direction. However, in another embodiment, another mechanism might be used for pinning the magnetizations 212" and 252" in the desired direction. In a preferred embodiment for magnetic memory applications, the magnetizations 212" and 252" are preferably parallel. However, other orientations may be used.

The pinned layers 210" and 250" each preferably includes at least one of Co, Ni, and Fe. The pinned layers 210" and 250" each has its magnetization 212" and 252", respectively, pinned in the desired direction(s). These direction(s) may, for example, be along or perpendicular to the easy axis of the free layer 230". The pinned layers 210" and 250" are shown as simple layers. However, the pinned layer 210" and/or 250" may be a multilayer. For example, the pinned layer 210" and/or 250" may be an SAF layer including two ferromagnetic layers separated by a thin non-magnetic conductive layer, such as Ru. The ferromagnetic layers for such an SAF would preferably have their magnetizations aligned antiparallel.

The barrier layers 220" and 240" are nonmagnetic and insulating. The barrier layers 220" and 240" are each thin, allowing tunneling of charge carriers through the barrier layer 220" and 240" when a current is driven through the dual MTJ 200" in a current-perpendicular-to-plane (CPP) configuration (in the z-direction in FIG. 5). Consequently, current carriers may tunnel through the barrier layer 220" and the barrier layer 240". In a preferred embodiment, the material(s) used for the barrier layer 220" includes MgO. In such an embodiment, the MgO is preferably crystalline, cubic in structure, and has (100) orientation. The barrier layer 240" may thus be crystalline or amorphous. As a result, the dual MTJ 200" may have a high magnetoresistance. Also in a preferred embodiment, the barrier layer 240" includes either MgO or aluminum oxide.

The free layer 230" is analogous to the free layer 130 depicted in FIG. 2 and to the free layers 230 and 230' depicted in FIGS. 3 and 4, respectively. Referring back to FIG. 5, the free layer 230" thus includes ferromagnetic layers 232" and 236" separated by an intermediate layer 234". The free layer 230" also includes, however, an additional intermediate layer 238 and an additional ferromagnetic layer 239. In some embodiments, the magnetic element 200" may be configured such that the free layer 230" may have its magnetic state changed due to spin transfer. Consequently, the dimensions of the free layer 230" for such applications are preferably small, in the range of few hundred nanometers. The ferromagnetic layers 232" and 236" are ferromagnetically coupled, for example through RKKY, orange peel coupling, or pinholes. Similarly, the ferromagnetic layers 239 and 236" are ferromagnetically coupled. The ferromagnetic layer 232" is preferably CoFeX or CoFeNiX, where X is selected from the group of B, P, Si, Nb, Zr, Hf, Ta, and Ti. In addition, X is from zero atomic percent to not more than thirty atomic percent. In a preferred embodiment, X is at least five atomic percent. Thus, the ferromagnetic layer 232" preferably uses amorphous materials that transform to crystal structures with desired texture after post heat treatment and recrystallization. Thus, the ferromagnetic layer 232" is preferably configured to have a higher magnetoresistance, particularly when used with an MgO barrier layer 220". The ferromagnetic layer 236" may include CoFeY or NiFe, where Y is selected from the group of B, P, Si, Nb, Zr, Hf, Ta, and Ti. In addition, Y is from zero atomic percent to not more than thirty atomic percent. In a preferred embodiment, Y is at least five atomic percent. In a preferred embodiment, the ferromagnetic layer 236" is NiFe. The ferromagnetic layer 239 may include CoFeZ or CoFeNiZ, where Z is selected from the group of B, P, Si, Nb, Zr, Hf, Ta, and Ti. In addition, Z is from zero atomic percent to not more than thirty atomic percent. In a preferred embodiment, Z is at least five atomic percent.

The intermediate layers 234" and 238 are nonmagnetic and configured such that the ferromagnetic layers 232" and 236" and the ferromagnetic layers 236" and 239, respectively, have different crystalline orientations. The intermediate layers 234" and 238 can be considered to be configured for texture reconstruction or as separate layers around which the free layer 230" has different crystalline orientations. These different crystalline orientations are configured to maintain a high magnetoresistance (signal) while providing better soft magnetic performance. The intermediate layer 234" may thus act as an intermediate media that either stops texture epitaxial growth between different parts/layers 232" and 236" of the free layer 230" if the intermediate layer 234" is in a thin regime, or bridges the parts 232" and 236" of the free layer 230" having different crystalline orientations if the intermediate layer 234" is in a thicker regime. The same holds true of the intermediate layer 238. The intermediate layers 234" and 238 each may include at least one of Ru, Ir, Rh, Hf, Zr, Ta, and Ti. However, the intermediate layers 234" and 238 are each preferably Ru having a thickness of at least one Angstrom and not more than five Angstroms. In a preferred embodiment, the orientation of the ferromagnetic layers 232" and 239 is (002), while the orientation of the ferromagnetic layer 236" is (111). Also in a preferred embodiment, the orientation of each of the intermediate layers 234" and 238 is hcp (002). Thus, the intermediate layers 234" and 238 may help to prevent crystalline propagation from the ferromagnetic layer 236" to the ferromagnetic layer 232" and from the ferromagnetic layer 239 to the ferromagnetic layer 236" due to a post-deposition anneal, for example at temperatures at or above approximately three hundred degrees Celsius. In addition, the intermediate layers 234" and 238 preferably prevents atomic interdiffusion during such a post-deposition anneal.

The dual MTJ 200" shares many of the benefits of the MTJ 100. Thus, the MTJ 200" has improved magnetoresistance, thermal stability, resistance to electrical stresses, and soft magnetic properties. Moreover, an enhanced signal due to the presence of two pinned layers 210" and 250" may be achieved. Thus, the dual MTJ 200" may be suitable for HDD and field-switched magnetic memories.

Figure 6:
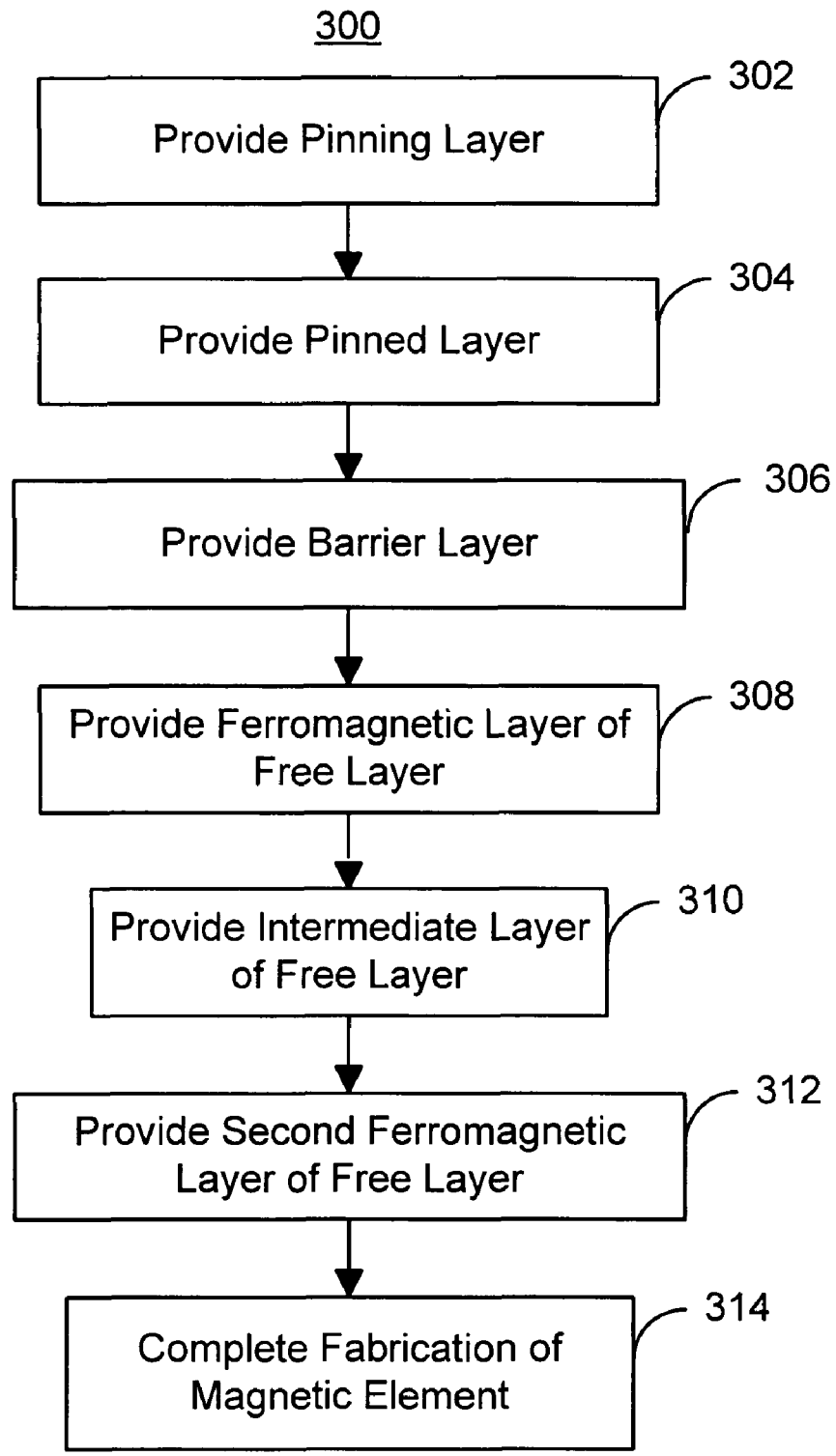
FIG. 6 is a flow chart depicting one exemplary embodiment of a method for providing one embodiment of a magnetic element having an engineered free layer.

FIG. 6 is a flow chart depicting one exemplary embodiment of a method 300 for providing one embodiment of a magnetic element having an engineered free layer. The method 300 is described primarily in the context of the MTJ 100. However, one of ordinary skill in the art will readily recognize that the method 300 could also be used in providing other magnetic elements not inconsistent with the present invention. For clarity, steps may be omitted. In addition, one of ordinary skill in the art will readily recognize that certain steps may be combined or performed separately. For example, the method 300 is described in the context of providing layers of the magnetic element. In some embodiments, some or all of the layers of the magnetic element may be deposited and then the magnetic element is defined, typically by masking the layers and removing the exposed portions of the layers. Thus, formation of the magnetic element (and thus it individual layers) may not be considered completed until the magnetic element is defined. However, for clarity, the components of the magnetic element are described as being provided in a particular order. Similarly, although the steps of the method 300 are described in a particular order, at least some steps may be carried out in a different order in certain embodiments.

The method 300 preferably commences after the seed layer(s) 102, if any, have been provided. The pinning layer 104, which is preferably an AFM layer, is preferably provided, via step 302. The pinned layer 110 is provided on the AFM layer 104, via step 304. Step 304 preferably includes providing the desired materials for the pinned layer 110 and orienting the magnetization 112 of the pinned layer 110 in the desired direction. The barrier layer 120 is provided, via step 306. Step 306 preferably includes providing a crystalline MgO barrier layer 120 or an amorphous MgO barrier layer that is later transformed into crystalline through annealing.

The ferromagnetic layer 132 is provided, via step 308. Step 308 preferably includes providing the layer 132 of CoFeX and/or CoNiFeX, with X being selected from the group of B, P, Si, Nb, Zr, Hf, Ta, and Ti, and being from zero atomic percent to not more than thirty atomic percent. In a preferred embodiment, step 308 includes providing a ferromagnetic layer with an X of at least five atomic percent. The intermediate layer 134 is provided, via step 310. Thus, a nonmagnetic layer that may include at least one of Ru, Ir, Rh, Hf, Zr, Ta, and Ti is provided. In a preferred embodiment, step 310 provides an intermediate layer 134 that is composed of Ru, at least one Angstrom in thickness and not more than five Angstroms in thickness. The ferromagnetic layer 136 is provided, via step 312. In a preferred embodiment, step 312 includes forming the ferromagnetic layer 136 of CoFeX or NiFe. The remainder of the magnetic element is fabricated, via step 314. In one embodiment, for the magnetic element 100, step 314 may include providing capping layer(s) 106, as well as other steps. In another embodiment, for the dual MTJ 200, step 314 may include providing an additional barrier layer 240, providing a second pinned layer 250, providing a second pinning layer 260, and providing the capping layer(s) 270. Similarly, for the hybrid magnetic element 200', step 314 may include providing a conductive spacer layer 240', providing a second pinned layer 250', providing a second pinning layer 260', and providing the capping layer(s) 270'. Moreover, additional steps, such as trimming or lapping of the structure, as well as formation of surrounding structures, may be performed.

Thus, using the method 300, the magnetic element 100, 200, and/or 200' may be fabricated. Consequently, the benefits of these magnetic elements 100, 200, and/or 200' may be achieved. Furthermore, the method 300 and materials are described above is available and producible using conventional equipment resources for thin film manufacturing at ambient temperature. Consequently, degradation of the structure 100, 200, 200' during a higher temperature anneal may be reduced or avoided.

A method and system for providing and using a magnetic element has been disclosed. The method and system have been described in accordance with the embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic element comprising:
a pinned layer;
a barrier layer composed of crystalline MgO;
a free layer including a first ferromagnetic layer, a second ferromagnetic layer, and an intermediate layer between the first ferromagnetic layer and the second ferromagnetic layer, the barrier layer residing between the pinned layer and the free layer, the first ferromagnetic layer residing between the barrier layer and the intermediate layer, the first ferromagnetic layer being ferromagnetically coupled with the second ferromagnetic layer, the first ferromagnetic layer including at least one of CoFeX and CoNiFeX, with X being selected from the group of B, P, Si, Nb, Zr, Hf, Ta, Ti, and being greater than zero atomic percent and not more than thirty atomic percent, the intermediate layer being configured such that the first ferromagnetic layer has a first crystalline orientation and the second ferromagnetic layer has a second crystalline orientation different from the first ferromagnetic layer and wherein the first crystalline orientation is (002).

2. A magnetic element comprising:
a pinned layer;
a barrier layer including crystalline MgO;
a free layer including a first ferromagnetic layer, a second ferromagnetic layer, and an intermediate layer between the first ferromagnetic layer and the second ferromagnetic layer, the barrier layer residing between the pinned layer and the free layer, the first ferromagnetic layer residing between the barrier layer and the intermediate layer, the first ferromagnetic layer being ferromagnetically coupled with the second ferromagnetic layer, the first ferromagnetic layer including at least one of CoFeX and CoFeNiX with X being selected from the group of B, P, Si, Nb, Zr, Hf, Ta, Ti, and being greater than zero atomic percent and not more than thirty atomic percent, the second ferromagnetic layer including at least one of the CoFeX and NiFe, the intermediate layer being configured such that the first ferromagnetic layer has a first crystalline orientation and the second ferromagnetic layer has a second crystalline orientation different from the first ferromagnetic layer, the intermediate layer including Ru and having a thickness of at least one Angstrom and not more than five Angstroms, the first crystalline orientation being (002).

3. A magnetic recording head comprising:
a one magnetic element including a pinned layer, a barrier layer, and a free layer including a first ferromagnetic layer, a second ferromagnetic layer, and an intermediate layer between the first ferromagnetic layer and the second ferromagnetic layer, the barrier layer residing between the pinned layer and the free layer, the barrier layer including MgO, the first ferromagnetic layer residing between the barrier layer and the intermediate layer, the first ferromagnetic layer being ferromagnetically coupled with the second ferromagnetic layer, the first ferromagnetic layer including at least one of CoFeX and CoNiFeX, with X being selected from the group of B, P, Si, Nb, Zr, Hf, Ta, Ti, and being greater than zero atomic percent and not more than thirty atomic percent, the intermediate layer being configured such that the first ferromagnetic layer has a first crystalline orientation and the second ferromagnetic layer has a second crystalline orientation different from the first ferromagnetic layer, the first crystalline orientation being (002).

4. A magnetic element comprising:
a pinned layer;
a barrier layer including MgO;
a free layer including a first ferromagnetic layer, a second ferromagnetic layer, and an intermediate layer between the first ferromagnetic layer and the second ferromagnetic layer, the barrier layer residing between the pinned layer and the free layer, the first ferromagnetic layer residing between the barrier layer and the intermediate layer, the first ferromagnetic layer being ferromagnetically coupled with the second ferromagnetic layer, the first ferromagnetic layer including at least one of CoFeX and CoNiFeX, with X being selected from the group of B, P, Si, Nb, Zr, Hf, Ta, and Ti, and being greater than zero atomic percent and not more than thirty atomic percent, the intermediate layer being configured such that the first ferromagnetic layer has a first crystalline orientation and the second ferromagnetic layer has a second crystalline orientation different from the first ferromagnetic layer, the first crystalline orientation being (002).

* * * * *